United States Patent [19]

Onodera et al.

[11] Patent Number: 5,061,974

[45] Date of Patent: Oct. 29, 1991

[54] SEMICONDUCTOR LIGHT-EMITTING DEVICE OF ARRAY TYPE

[75] Inventors: Noriaki Onodera; Saburo Saski; Hiroyuki Iechi, all of Sendai, Japan

[73] Assignees: Ricoh Company, Ltd., Tokyo; Ricoh Research Institute of General Electronics Co., Natori, both of Japan

[21] Appl. No.: 455,146

[22] Filed: Dec. 22, 1989

[30] Foreign Application Priority Data

Dec. 28, 1988 [JP] Japan .................................. 63-329224
Jan. 10, 1989 [JP] Japan ....................................... 1-1975
Oct. 20, 1989 [JP] Japan ..................................... 1-274586

[51] Int. Cl.5 ............................................. H01L 33/00
[52] U.S. Cl. ......................................... 357/17; 357/55; 372/50
[58] Field of Search ............... 357/17, 16, 55; 372/50, 372/45

[56] References Cited

U.S. PATENT DOCUMENTS

| 4,101,845 | 7/1978 | Russer | 331/94.5 |
|---|---|---|---|
| 4,614,958 | 9/1986 | Mikami et al. | 357/19 |
| 4,794,609 | 12/1988 | Hara et al. | 357/19 |
| 4,801,993 | 1/1989 | Ankri et al. | 357/19 |
| 4,803,691 | 2/1989 | Scifres et al. | 372/150 |
| 4,831,630 | 5/1989 | Scifres et al. | 372/50 |
| 4,868,614 | 9/1989 | Yamazaki | 357/17 |

FOREIGN PATENT DOCUMENTS

| 52-49787 | 4/1977 | Japan | 357/19 |
|---|---|---|---|
| 60-85579 | 5/1980 | Japan | 357/19 |
| 55-74190 | 6/1980 | Japan | 357/19 |
| 57-16081 | 10/1982 | Japan | 357/19 |
| 58-153378 | 9/1983 | Japan | 357/19 |
| 61-248584 | 11/1986 | Japan | 372/50 |
| 61-280693 | 12/1986 | Japan | 372/50 |
| 62-4385 | 1/1987 | Japan | 372/50 |
| 62-14479 | 1/1987 | Japan | 357/19 |

Primary Examiner—Jerome Jackson, Jr.
Assistant Examiner—D. Monin
Attorney, Agent, or Firm—Oblon, Spivak, McClelland, Maier & Neustadt

[57] ABSTRACT

A semiconductor light-emitting device includes a pair of clad layers and an active layer sandwiched thereby which together are disposed between a substrate and a cap layer so as to form a monolithic array of double-heterojunction regions each including therein a plurality of light-emitting portions of the active layer for emitting light from the end face thereof so that the light-emitting portions are arrayed in a row and electrically separated from each other. The substrate is formed at one side thereof with a concave and convex configuration following a stripe pattern so that the clad layers, active layers and the cap layers are each arranged in the form of a corrugated configuration following the concave and convex configuration of the substrate. According to the corrugated configuration of the active layer between said clad layers, one of the clad layers has portions which are each disposed between respective two successive light-emitting portions of the active layer along an array line thereof, so that when at least two successive light-emitting portions are activated to emit light, these successive light-emitting portions are also photo-coupled to each other through the corresponding portion of the clad layer disposed therebetween.

10 Claims, 5 Drawing Sheets

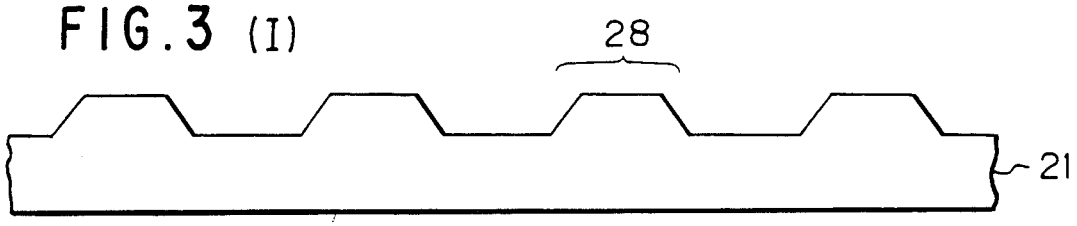
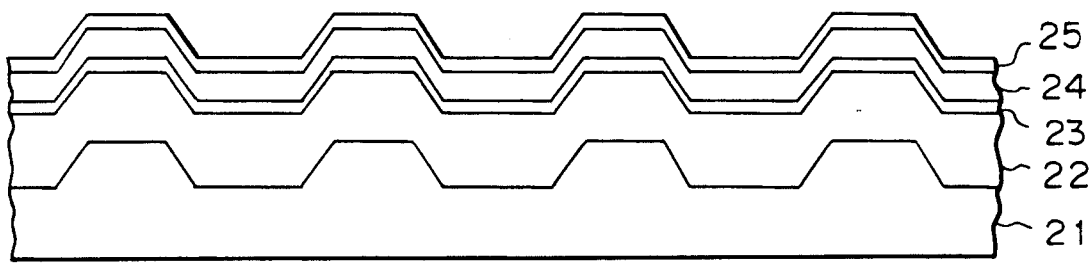
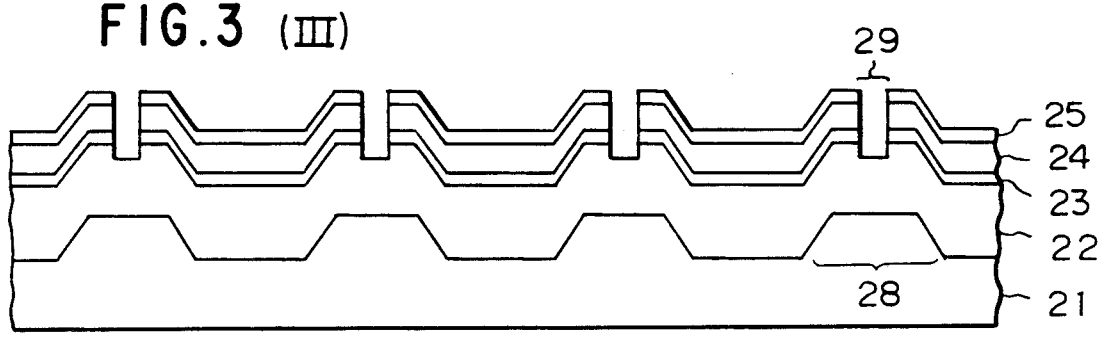
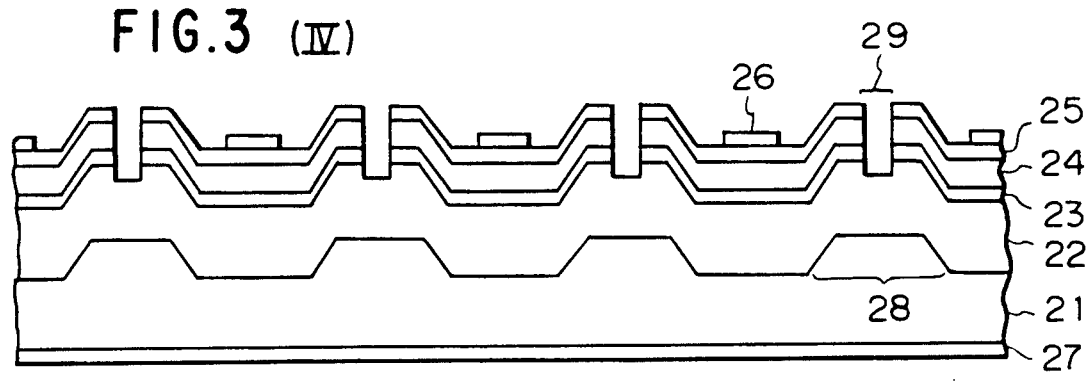

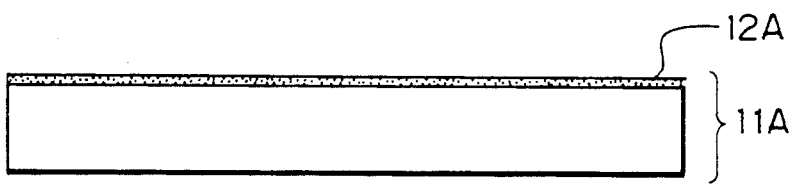
FIG.6 (I)
FIG.6 (II)
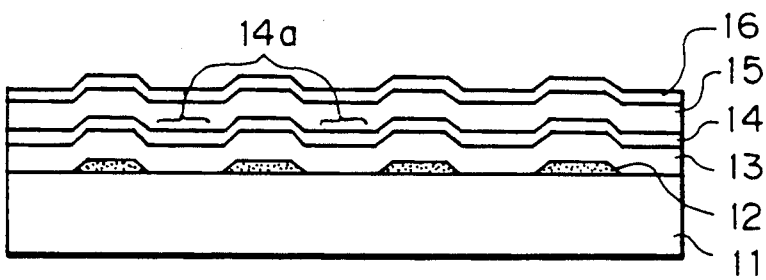
FIG.6 (III)
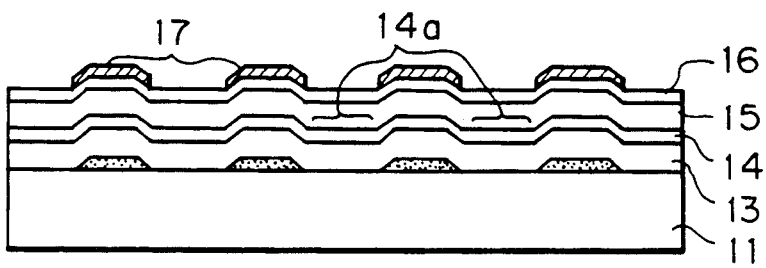
FIG.6 (IV)
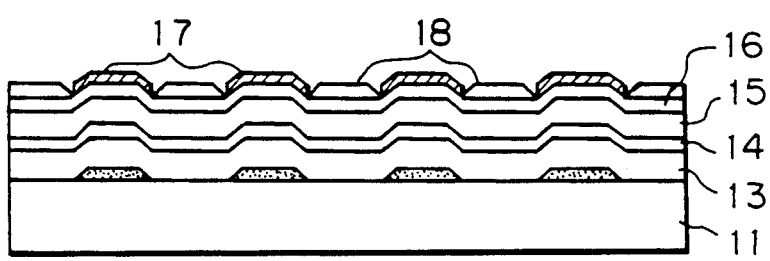
FIG.6 (V)
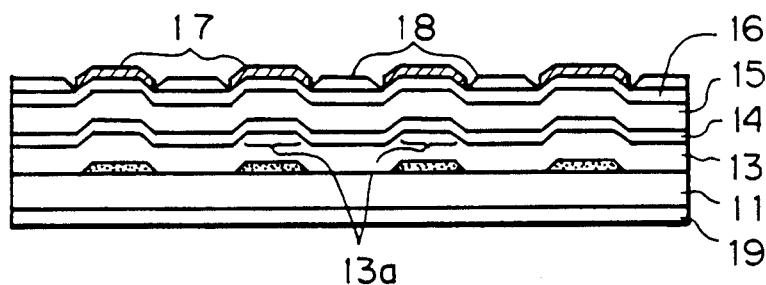
FIG.6 (VI)

SEMICONDUCTOR LIGHT-EMITTING DEVICE OF ARRAY TYPE

BACKGROUND OF THE INVENTION

The present invention relates generally to a semiconductor light-emitting device of array type. More particularly, the invention relates to a semiconductor light-emitting device having a monolithic array of double-heterojunction regions each including a light-emitting portion for emitting light from the end face thereof.

Applied Physics Letters, Vol. 41, No. 11, pp. 1040 to 1042, published on Dec. 1, 1982, discloses an exemplary semiconductor light-emitting device having an individually addressable monolithic array of double-heterojunction light-emitting regions each including a light-emitting portion for emitting light from the end face thereof, wherein the light-emitting portions are arrayed in a row and electrically separated from each other so as to enable individual addressing thereto.

Such a conventional semiconductor light-emitting device of array type can be used as a light-source element of a printing head in an optical printer such as laser printer, since the light-emitting portions can be addressed individually.

However, the above-mentioned conventional device has the following defects.

Namely, when all the light-emitting portions of the above-mentioned device of array type are activated to emit light, a near visual pattern of light which is formed outside the light-emitting portions is characterized in that light spots each having a diameter of about 3 μm are aligned at the interval of about 150 μm in a direction along the array of light-emitting portions.

For this reason, when such a conventional semiconductor light-emitting device of array type is used as a light-source element of a printing head and is used for forming a so-called black solid printed portion, a region between respective two successive light-emitting portions tend to be underexposed, resulting in the formation of an insufficient or uneven image as the solid portion.

SUMMARY OF THE INVENTION

It is therefore an object of the present invention to provide a novel semiconductor light-emitting device of monolithic array type which makes it possible to prevent lack of exposure between adjacent two light-emitting portions when both the two light-emitting portions are energized to emit light.

Another object of the invention is to provide a novel semiconductor light-emitting device of array type which makes it possible to emit light from a region between two successive light-emitting portions when both the two light-emitting portions are energized for emitting light.

The above-mentioned objects can be achieved by a semiconductor light-emitting device of array type comprising a pair of clad layers and an active layer sandwiched thereby which together are disposed between a substrate and a cap layer so as to form a monolithic array of double-heterojunction regions each including therein a plurality of light-emitting portions of the active layer for emitting light from the end face thereof so that the light-emitting portions are arrayed in a row and electrically separated from each other, wherein the substrate is formed at one side thereof with a concave and convex configuration following a stripe pattern so that the clad layers, active layers and the cap layers are each arranged in the form of a corrugated configuration following the concave and convex configuration of the substrate, and wherein, due to the corrugated configuration of the active layer between the clad layers, one of the clad layers has portions which are each disposed between two successive light-emitting portions of the active layer along the array line thereof so that when at least two successive light-emitting portions are activated to emit light, these successive light-emitting portions are also photo-coupled to each other through the corresponding portion of the clad layer disposed therebetween.

In this description and claims, the term "array line" of the light-emitting portions means imaginary lines drawn through the light-emitting portions. Since light emission is conducted at the active layer in the double-heterojunction regions, the light-emitting portions are parts of the active layer.

As mentioned above, each light-emitting portion is electrically separated from each other. The separation between the light-emitting portions may be carried out by means of separation grooves or conductive diffusion regions having an electric conductivity which is opposite to that of the light-emitting region. The diffusion regions may be formed at regions between respective two successive light-emitting portions. The separation also may be carried by means of current block layers which may be formed in the substrate at convex portions of the concave and convex configuration thereof. Of course, the above-mentioned separation means may be used individually or in the form of a combination of the two or more means.

Various kinds of methods for constricting an electric current may be suitable for effectively carrying out the electrical separation of the light-emitting portions.

One of the electrodes is provided on the cap layer while the other is provided on the back side of the substrate. When both electrodes are each in the form of a common electrode in relation to all the light-emitting portions, the emission of light from all the light-emitting portions can be performed simultaneously. When the electrode on the cap layer is formed in a stripe or matrix shape, individual addressing to the respective light-emitting portions ca be made easily.

As well known, in the semiconductor light-emitting element of a double-heterojunction structure, the clad layer has a forbidden band gap which is wider than that of the active layer. For this reason, generally, the clad layer does not absorb photon generated in the active layer and acts as a transparent substance with respect to the light generated at the active layer.

In the semiconductor light-emitting device of array type of the present invention, as mentioned above, the portions of one of the clad layer and the light-emitting portions of the active layer are alternately lined up on the array line of the light-emitting portions.

Thus, when light is generated at the light-emitting portions of the active layer due to the re-coupling of carriers, a part of the generated light is emitted directly from the end face thereof, and another part of the generated light is exuded from the active layer into the adjacent clad layer, so that light is also discharged from the clad layer. Namely, when two successive light-emitting portions are activated to emit light, these two successive light-emitting portions are also photo-coupled to each other through light wave-guided within the portion of the clad layer disposed between the light-emitting portions. Therefore, when two or more successive light-emitting portions are activated to emit light, a near visual pattern formed near the end faces of the light-emitting portions has a continuous distribution of intensity of light.

Accordingly, when the device according to the present invention is used as a light source device for a printing head of an optical printer, printed letters at black solid portions can be assuredly obtained. Moreover, since the electrical separation of the light-emitting portions from each other can be made by the above-described simple structure, it becomes possible to arrange the light-emitting portions in high density Further objects, features and advantages of the present invention will become apparent from the following description of the preferred embodiments of the present invention as illustrated in the accompanying drawings.

BRIEF DESCRIPTION OF THE DRAWINGS

FIGS. 3I–3IV are view for explaining a method for fabricating the device shown in FIG. 1;

FIGS. 6I–6VI are view for explaining a method for fabricating the device shown in FIG. 5.

DETAILED DESCRIPTION OF THE INVENTION

Figure 1:
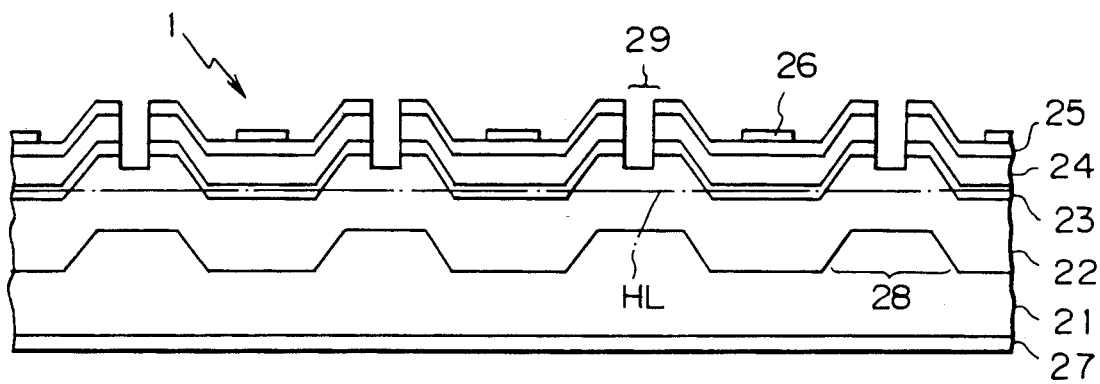
FIG. 1 is a schematic cross-sectional view of a semiconductor light-emitting device of array type constructed as one embodiment of the present invention.

Referring to FIG. 1, there is schematically shown a cross-section of a semiconductor light-emitting device of array type according to one embodiment of the present invention, which is generally represented by reference numeral 1.

The semiconductor light-emitting device 1 comprises a substrate 21, a first clad layer 22, an active layer 23, a second clad layer 24, a cap layer 25, a plurality of individually separated electrodes 26, and a common electrode 27. The active layer 23 includes a plurality of light-emitting portions which are spaced from each other and arrayed along the imaginary line HL shown in FIG. 1, as described later in more detail.

The substrate 21 is made of nGaAs. The one side of the substrate 21, on which a double-heterojunction structure is to be applied, is formed with concaves and convexes 28 following a predetermined stripe pattern.

Namely, each of the convexes 28 of the substrate 21 is in the form of a linear protrusion having substantially a trapezoidal cross-section and extending in finite length in an orthogonal direction with respect to the surface of the drawing. The convexes 28 are arrayed at a regular interval in the left and right directions in FIG. 1.

The first clad layer 22, the active layer 23, the second clad layer 24 and the cap layer 25 are successively stacked on the one side of the substrate 21 in the above-mentioned manner so as to construct a monolithic array of double-heterojunction regions each including the light-emitting portion of the active layer 23. Since these layers are thin in their thickness, each layer is formed so as to follow the concave and convex structure of the substrate 21. Accordingly, the surface of the cap layer 25 as an upmost layer has a periodical concaves and convexes which reflect the concave and convex structure of the substrate 21.

The clad layer 22 is made of n-$Al_{0.4}Ga_{0.6}As$ having a forbidden band gap greater than that of the substrate 21. The active layer 23 is made of n-GaAs having a forbidden band gap which is smaller than that of the clad layer 22. The clad layer 24 is made of p-$Al_{o.r}Ga_{o.o}As$ having a forbidden band gap which is greater than that of the active layer 23. Further, the cap layer 25 is made of p-GaAs having a forbidden band gap which is smaller than that of the clad layer 24.

The electrodes 26 and 27 are ohmic electrodes.

The electrodes 26 provided on the cap layer 25 are a p-type ohmic electrode and are individually separated from each other in the form of a stripe shape so as to correspond to the individually separated light-emitting portions of the active layer 23. Each separated electrode 26 is arranged on every concave portion of the concave and convex structure of the cap layer 25. Accordingly, the array pitch and array phase of the electrodes 26 correspond to the pitch and phase of the concave portion of the concave and convex structure of the substrate 21.

On the other hand, the electrode 27 is a n-type ohmic electrode. The electrode 27 which is common with respect to all the separated electrodes 26 is formed on the back side of the substrate 21.

Each convex portion at the cap layer 25 is formed with a separation groove 29 having a depth reaching the clad layer 22, and thus the light-emitting portions are electrically separated from each other through the separation grooves 29.

As voltage is applied between one of the electrodes 26 and the common electrode 27 in forward direction, i.e., in a manner that the electrode 26 becomes plus side", an electrical current flows from the electrode 26 into the common electrode 27 through the cap layer 25, the clad layer 24, the active layer 23, the clad layer 22 and the concave portion of the substrate 21. This causes carriers in the active layer 23 to be re-coupled, whereby generating light.

A part of the generated light is then emitted from the end face of the active layer 23 at a region between the applied electrodes 26 and 27, i.e., at the light-emitting portion of the active layer 23. Since the light-emitting portion of the active layer 23 at which light emission is conducted is in contact at the opposite lateral sides thereof with the clad layer 22, another part of the generated light is exuded into the clad layer 22, causing light to be emitted from the end face cf the clad layer 22. The thickness of the active layer 23 is sufficiently thin in comparison to the width of the concave portion of the active layer 23 (i.e., the width measured in the left and right direction in FIG. 1), so that when light emission is conducted at one light-emitting portion in the above-mentioned manner, a light spot having a shape elongated in the direction of the array of the light-emitting portions can be obtained.

Figure 2:
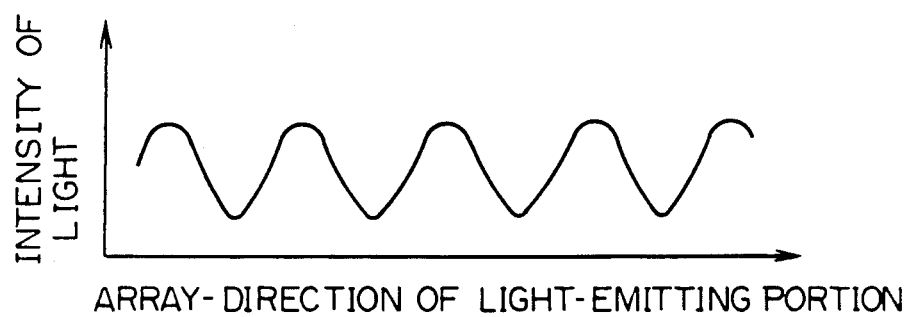
FIG. 2 shows the distribution of light intensity typically obtained by the device shown in FIG. 1.

When voltage is applied between the adjacent electrodes 26 and the common electrode 27 in forward direction to generate light in the corresponding light-emitting portions of the active layer 23, a part of the generated light is then directly emitted from the end face of the light-emitting portions, while another part of the generated light is exuded from the light-emitting portion into the adjacent convex portion of the clad layer 22 which exists between the adjacent light-emitting portions. In this way, the two successive light-emitting portions can be photo-coupled to each other through the clad layer convex portion disposed therebetween. Accordingly, when light is emitted from two adjacent light-emitting portions of the active layer 23, light is also emitted from the end face of the clad layer convex portion disposed between the adjacent light-emitting portions. This means that the intensity of light in the near visual pattern does not become zero even at the intermediate between the two successive light-emitting portions. Accordingly, when light is emitted from a plurality of successive light-emitting portions of the active layer 23, the distribution of light intensity in the near visual pattern becomes continuous along the array line HL of the light-emitting portions, as shown in FIG. 2.

In order to ensure the coupling of light within the convex portion of the clad layer 22 between respective two successive light-emitting portions of the active layer 23, the aforementioned separation grooves 29 have to be so arranged that the bottom of the separation grooves 29 does not reach the array line HL.

Explanation will now be made as to a method for fabricating the device shown in FIG. 1, with reference to FIG. 3.

First, as shown in FIG. 3(I), a substrate 21 made of n-GaAs is formed at one side thereof with concaves and convexes 28 in accordance with a stripe pattern. For the formation of the concaves and convexes on the substrate 21, etching, e.g., chemical etching, reactive ion etching or the like, may the utilized. Preferably, the height of the convex portions 28 to be formed is approximately equal to one-half of the thickness of the clad layer 22.

Next, as shown in FIG. 3(II), a clad layer 22 made of n-$Al_{0.4}Ga_{0.0}As$, an active layer 23 made of n-GaAs, a clad layer 24 made of p-$Al_{0.4}Ga_{0.0}As$, and a cap layer 25 made of p-GaAs are successively stacked on the side of the substrate 21 at which the concaves and convexes are formed. It is preferable, as the method for growing each layer, to utilize molecular beam epitaxy method (MBE method) or the like, so that each layer can be formed in dependence on the concave and convex shape of the substrate 21. It is also preferable, as the method for growing each layer, to utilize various vapour-phase epitaxy methods such as halide-vapour phase epitaxy method (halide-VPE method), organometallic vapour-phase epitaxy method (MO-VPE method) or the like.

After the above-mentioned layers 22–25 are stacked on the substrate 21, separation grooves 29 are provided as shown in FIG. 3(III). Preferably, each separation groove 29 is about 1 to 3 $\mu$m in width and about 1 to 5 $\mu$m in depth. The above-mentioned chemical etching, reactive ion etching or the like may be used for forming the separation grooves 29.

As a final step, as shown in FIG. 3(IV), a p-type ohmic electrodes 26 is provided on each concave portion of the cap layer 25, and the n-type ohmic electrode 27 as a common electrode is provided on the back side of the substrate 21 over the array line of light-emitting portions of the active layer 23.

In this way, the semiconductor light-emitting device of array type as shown in FIG. 1 can be obtained.

Figure 4:
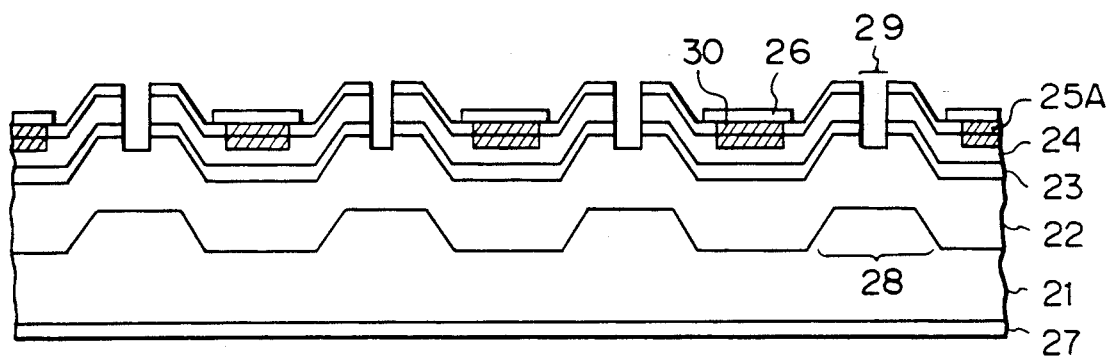
FIG. 4 is a schematic cross-sectional view of a semiconductor light-emitting device of array type constructed as another embodiment of the invention.

Referring now to FIG. 4, there is shown: a semiconductor light-emitting device of array type according to another embodiment of the present invention. In the embodiment shown in FIG. 4, some constituent elements which are substantially the same as those in the embodiment shown in FIG. 1 are denoted by the same reference numerals, respectively, for the purpose of clarity and simplicity of explanation.

The embodiment shown in FIG. 4 is characterized in that a cap layer 25A is made of n-GaAs and that Zn-diffused p-region 30 is formed by diffusing zinc to both a part of the cap layer 25A positioned beneath each electrode 26 and a part of the clad layer 24.

According to this construction, the Zn-diffused p-region 30 located transversely to a current passage between one of the electrodes 26 and the corresponding light-emitting portion of the active layer 23 can act to constrict the flow of electric current, whereby making it possible to ensure the electric separation of the light-emitting portions from each other.

The means for constricting the flow of electric current is not limited to the Zn-diffused p-region 30, and many alternatives thereof such as shown in further embodiments described later may be applied to the device of the invention. Also various kind of structures which are known as means for constricting the flow of current in a semiconductor laser or light emitting diode (LED) may be utilized.

Although explanation of the embodiments applied to the device of GaAs system has been made in conjunction with FIGS. 1 and 3, it will be appreciated that the structure of the above-mentioned embodiments may be also applied to devices of InGaAsP system.

Further, the material of the active layer is not limited to that of GaAs system. For example, AlGaAs layer may be used as the active layer. In this case, also the clad layers may be made of AlGaAs having a molarity of Al which is greater than that of the active layer.

Figure 5:
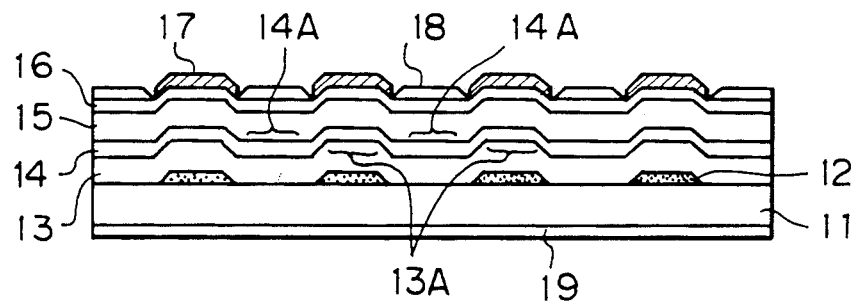
FIG. 5 is a schematic cross-sectional view of a semiconductor light-emitting device of array type constructed as a further embodiment of the invention.

Referring now to FIG. 5, there is shown a semiconductor light-emitting device of array type according to another embodiment of the present invention, in which a substrate 11 is made of n-GaAs and is periodically provided with convex portions 12 so that concave and convex shape following the stripe pattern is formed. In this embodiment, each of the convex portions of the substrate 11 defines p+region therein.

As shown in FIG. 5, a first clad layer 13, an active layer 14, a second clad layer 15 and a cap layer 16 are successively stacked on one side of the substrate 11 at which the convex portions 12 are formed in a manner as described. Each layer is grown in the shape following the concave and convex shape of the substrate 11. Accordingly, the surface of the cap layer 16 has concaves and convexes having the same pitch and the same phase as those of the concave and convex shape of the substrate 11, as like as that of the aforementioned embodiments. Individually separated electrode 18 is provided in each concave portion of the cap layer in a stripe shape. A common electrode 19 which is common with respect to all the separated electrodes 18 is provided on the back side of the substrate 11. Each convex portion of the cap layer 16 is coated with an insulating film 17.

The first clad layer 13 is made of n-$Al_{0.33}Ga_{0.67}As$, while the active layer 14 is made of n-$Al_{0.06}Ga_{0.94}As$ Further, the clad layer 15 is made of p-$Al_{0.33}Ga_{0.67}As$ while the cap layer 16 is of p-GaAs. The insulating film 17 is of, for example, a thin film made of $SiO_2$, etc.

Each of the separated electrodes 18 has a two-layer metal structure comprising Au-Zn and Au layers, while the common electrode 19 has a three-layer metal structure comprising Au-Ge, Ni and Au layers. On the other hand, the p+region defined in each of the convex portions 12 of the substrate 11 is formed by diffusion of Zn as described later in more detail.

When voltage is applied in forward direction between one of the separated electrode 18 and the common electrode 19, the electric current flows from the electrode 18 into the electrode 19 through the corresponding concave portion of the cap layer 16, the second clad layer 15, the active layer 14, the first clad layer 13 and the substrate 11.

At this time, each of the convex portions 12 adjacent to the substrate concave portion corresponding to the electrode 18 acts as a current guide for guiding the flow of the electric current toward the concave portion of the substrate 11. Namely, each of the substrate convex portions 12 forming the p+region makes it possible to ensure the electrical separation of the light-emitting portions of the active layer 14 from each other.

Each of concave portions of the active layer 14, i.e., the light-emitting portions 14A thereof can emit light from the end face thereof. Further, respective two successive light-emitting portions 14A can be photo-connected through one of convex portions 13A of the clad layer 13. Furthermore, due to the concave and convex structure of each layer, the light-emitting portions 14A of the active layer 14 and the convex portions 13A of the clad layer 13 are alternately aligned in a row. Accordingly, a near visual pattern of light having no break in the distribution of light intensity can be obtained similarly to the aforementioned embodiments.

Explanation will now be made as to a method for fabricating the device shown in FIG. 5, with reference to FIG. 6.

First, as shown in FIG. 6(I), a plate 11A of n-GaAs which becomes a substrate 11 of the device is subjected to Zn-diffusion at 700° C. for about one hour to form p+region 12A.

Next, as shown in FIG. 6(II), the p+region 12A is selectively removed by photolithography process and etching process, which uses etchant of $H_2SO_4:H_2O_2:H_2O$ system, so as to retain convex portions 12 in accordance with a predetermined stripe pattern. Thus, the substrate 11 having the concave and convex shape following the stripe pattern can be obtained.

Then, as shown in FIG. 6(III), a first clad layer 3, an active layer 14, a second clad layer 15 and a cap layer 16 are successively stacked on the substrate 11 by using crystal growth method such as MBE method, chloride-VPE method, MOCVD method, etc.

Succeedingly, as shown in FIG. 6(IV), an insulating film made of $SiO_2$ is deposited on the cap layer 16 with the thickness of about 2000 Å by using EB vaporization method or CVD method and then, it is arranged to retain only the insulating films 17 on the convex portions of the cap layer 16 by photolithography process and etching process.

After that, as shown in FIG. 6(V), p-type electrodes 18 having two-layer metal structure comprising Au-Zn and Au layers are formed on the exposed concave portions of the cap layer 16 by vacuum vaporization and lift-off method.

Finally, as shown in FIG. 6(VI), n-type electrode 19 having three-layer metal structure comprising Au-Ge, Ni and Au layers is formed on the back side of the substrate 11 to obtain the desired semiconductor light-emitting device of array type.

Explanation will now be made as to still further embodiments of the present invention, which are illustrated in FIGS. 7 to 11, respectively. In these embodiments, the same constituent elements as those in the above-mentioned embodiment shown in FIG. 5 are designated by the same reference numerals for the purpose of clarity.

Figure 7:
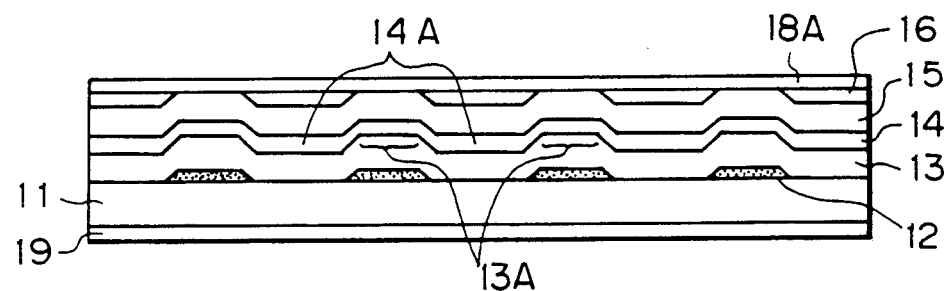
FIGS. 7 to 11 are views for explaining still further embodiments of the invention, respectively.

In the embodiment shown in FIG. 7, after a substrate 11 having convex portions 12, a first clad layer 13, an active layer 14, a second clad layer 15, and a cap layer 16 are successively formed by the same processes as those shown in FIGS. 6(I) to 6(III), the convex portion of the cap layer 16 is selectively removed and an electrode 18A is formed on the surface of the cap layer 16 and the clad layer 14 being arrayed in a strip shape, while another electrode 19 is formed on the back side of the substrate 11.

As apparent from FIG. 7, the electrode 18A is not individually separated. Accordingly, when voltage is applied in forward direction between the electrodes 18A and 19, all the light-emitting portions of the active layer 14 are simultaneously activated to emit light. At this time, respective two successive light-emitting portions are photo-coupled with each other through a convex portion 13A of the clad layer 13 disposed therebetween, and accordingly, a near visual pattern of light can be formed without a break in the-distribution of light intensity, as in the aforementioned embodiments.

In the embodiment shown in FIG. 7, the more the molarity of Al composition of the clad layer of p-AlGaAs increases, the more the distribution of light intensity in the near visual pattern of light can be obtained in better form. Preferably, the molarity of Al composition in the clad layer 15 of p-AlGaAs is more than 0.5. In this case, it was confirmed from the experiments that when the convex portions of the cap layer were removed by using GaAs selection etchant of $NH_4OH:H_2O_2$ system, the surface of the clad layer 15 was also sufficiently oxidized and thus a high resistance layer was formed therein, and that more increased electrical separation of the light-emitting portions with respect to each o&:her could be obtained accordingly in comparison to the preceding embodiments.

Figure 8:
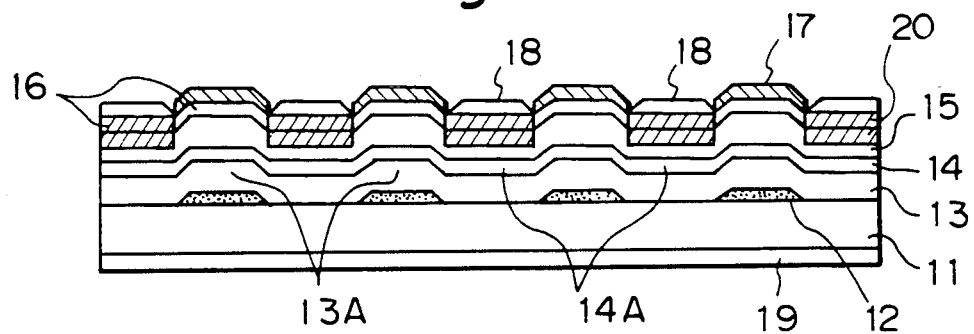

The embodiment shown in FIG. 8 is generally similar to that shown in FIG. 5, except that Zn-diffused regions 20, each for constricting the flow of electric current between one of individually separated electrodes 18 and a common electrode 19, are provided beneath the electrodes 18, respectively, as in the embodiment of FIG. 4.

Figure 9:
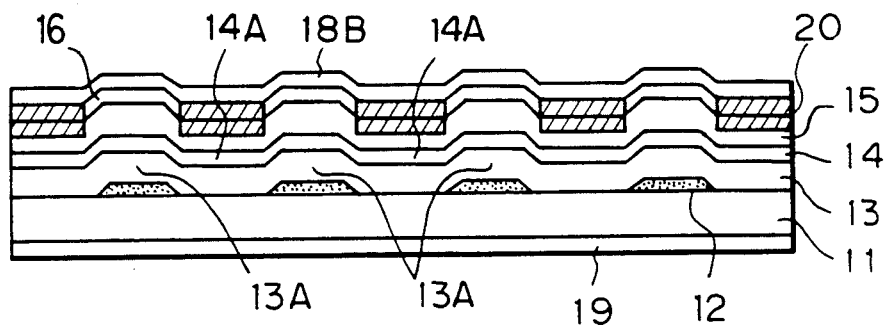

The embodiment shown in FIG. 9 is characterized in that a cap layer 16 is formed as a conductive layer, the conductive characteristic thereof being contrary to that of the clad layer 15. For example, when the clad layer 15 is made of p-AlGaAs, the cap layer 16 is made of n-GaAs. This embodiment is also characterized in that Zn-diffused region 20 which serves as an electric passage is formed in the concave portions of the cap layer 16, and that a common electrode 18B is provided on the cap layer 16, while another common electrode 19 is provided on the back side of the substrate 11. In this embodiment, when voltage is applied between the electrodes 18B and 19, all of the light-emitting portions of the clad layers 15 can be simultaneously activated to emit light, as in the embodiment of FIG. 7.

Figure 10:
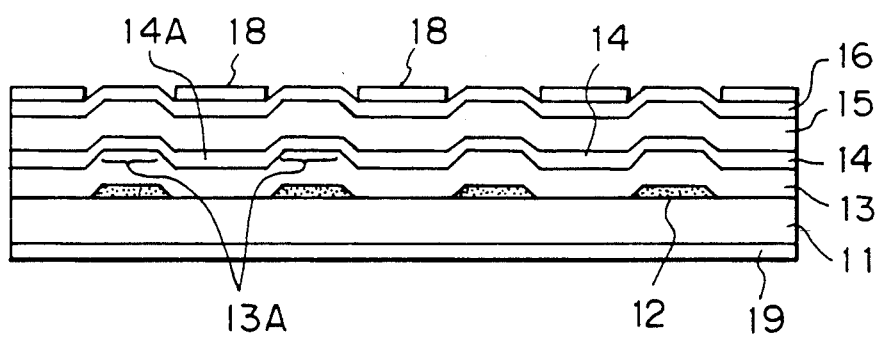

The embodiment shown in FIG. 10 is basically similar to the embodiment of FIG. 5, except that the insulating films as shown in FIG. 5 are omitted from the surface of the convex portions of the cap layer 16 for simplicity in construction and fabrication thereof.

Figure 11:
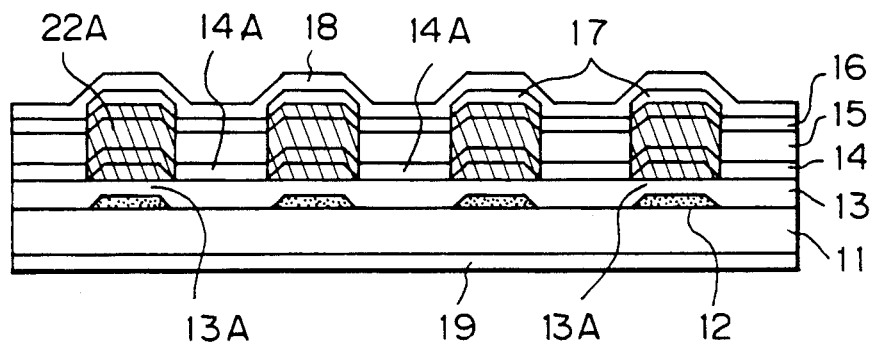

The embodiment shown in FIG. 11 is characterized in that after a substrate 11 having a protrusions 12 and layers 13 to 16 are fabricated by the same processes as those shown in FIGS. 6(I) to 6(III), electric diffusion regions 22A each having a conductivity which is contrary to the region of light-emitting portions of the active layer 14, are formed by deeply diffusing Si into the convex portions of the layers 16 to 13. After that, insulating films 17 are formed on the convex portions of the cap layer 16, respectively, and the surfaces of the insulating films 17 as well as the surfaces of the cap layer 16 are together covered with a common electrode 18b, while the back side of the substrate 11 is covered with another common electrode 19.

Although in the embodiment illustrated in FIG. 11, the bottom level of each of the Si-diffused regions 22A is made substantially equal to the level of the concave portions of the clad layer 14, the diffusion regions may be extended to reach the substrate 11.

According to the construction as illustrated in FIG. 11, it is possible to obtain increased electrical separation of the light-emitting portions with respect to each other in comparison to the preceding embodiments.

In the embodiments of FIGS. 7, 9 and 11, the common electrodes are provided on opposite sides of the device, and it is impossible to perform selective addressing to the respective light-emitting portions. However, it is possible to apply a matrix structure to at least one of the opposite common electrodes so that selective addressing to the respective light-emitting portions can be performed.

In the case that selective addressing to the respective light-emitting portions is possible, it is possible to separate, for example, two adjacent spots of emitted light from each other, by activating two light-emitting portions to emit light which are positioned at the both sides of an optional light-emitting portion which, in turn, is maintained in the disactivated state.

Although explanation has been made as to the embodiments of FIGS. 5–11 in which the convex portions 12 of the substrate 11 are each formed by Zn-diffusion. Also Si, Be, Mg or the like may be used as the material to be diffused. Further, the convex portions 12 of the substrate 11 may be respectively formed as an epitaxial layer instead of the diffusion layer..

Furthermore, the embodiments of FIGS. 5–11 can be also practised by using various compound semiconductor or mixed crystal semiconductor, for example, InGaP, InGaAs or InGaAsP or the like in stead of the above-mentioned AlGaAs.

When the common electrode is provided on the cap layer as shown in FIGS. 7, 9 and 11, the common electrode also serves as a effective heat radiating member, so that heat generated in the light-emitting device along with the emission of light can be sufficiently radiated from the wide surface of the common electrode to effectively reduce the rise of temperature of the device.

In addition, it is of course possible to separate the semiconductor light-emitting device of array type of the present invention into a plurality of independent light-emitting devices having a single light-emitting portion.

Although the foregoing explanation has been made as to the specific constructions of the present invention applied to the double heterojunction structure, the invention may be applied to other type of multi-layered double heterojunction LOC (Large Optical Capacity) structure, as far as a clad layer is disposed between each two successive light-emitting portions of the active layer so as to provide photo-coupling of the two light-emitting portion through the clad layer.

While the invention has been described in conjunction with specific embodiments and many alternatives thereof, it is evident that further alternatives and modifications will be apparent to those skilled in the art in light of the foregoing description. Accordingly, it is intended to include all such alternatives and modifications as fall within the spirit and scope of the appended claims.

What is claimed is:

1. A semiconductor light emitting device, comprising:
   a substrate having a first surface with a concave and convex configuration following a stripe pattern;
   a lower common electrode formed on said substrate at a second surface opposite said first surface;
   first current block layers formed in respective convex portions of said first surface of said substrate by impurity diffusion in such a manner that said convex portions have a conductivity type opposite to a conductivity type of the substrate;
   a first clad layer formed on said first surface of said substrate and said first current block layers in a corrugated configuration following said concave and convex configuration of said first surface of said substrate;
   an active layer formed on said first clad layer in said corrugated configuration following said concave and convex configuration so that said first clad layer has a portion disposed between two successive light emitting portions of said active layer along an array line extending through said light emitting portions;
   a second clad layer formed on said active layer in said corrugated configuration following said concave and convex configuration;
   cap layers respectively formed on at least concave portions of said second clad layer;
   second current block layers formed respectively above convex portions of said second clad layer; and
   upper electrodes formed on at least said cap layers.

2. A semiconductor light emitting device according to claim 1, comprising:
   said cap layers being integrally formed in said corrugated configuration following a concave and convex configuration of said second clad layer;
   each of said second current block layers being an insulating film formed on respective convex portions of said cap layer; and
   said upper electrodes being respectively formed on concave portions of said cap layer.

3. A semiconductor light emitting device according to claim 2, comprising zinc diffused regions being formed downward from said concave portions of said cap layer to said second clad layer.

4. A semiconductor light emitting device according to claim 1, comprising:
   said cap layers being respectively formed on concave portions of said second clad layer;
   said upper electrodes being integrally formed over convex portions of said second clad layer and said cap layers as a single upper common electrode; and said second current block layers being high resistance layers formed by oxidization on respective surfaces of said second clad layer being in contact with said upper common electrode.

5. A semiconductor light emitting device according to claim 1, comprising:

said cap layers being integrally formed on said second clad layer as a single cap layer in said corrugated configuration following a concave and convex configuration of said second clad layer;

each of said second current block layers being insulating films respectively formed on convex portions of said cap layer, said upper electrodes being formed on concave portions of said cap layer and said insulating layer as a single upper common electrode; and silicon diffused regions being respectively formed downward from convex portions of said cap layer.

6. A semiconductor light emitting device according to claim 1, comprising said portions of said first clad layer photo-coupling light emitted from said surrounding two successive light emitting portions of said active layer, and said emitted light having a continuous distribution in the near visible spectrum along said array line.

7. A semiconductor light emitting device according to claim 1, comprising said first and second current block layers isolating said light emitting portions and increasing current injection into said light emitting portions when a forward voltage is applied across said common electrode and said upper electrodes.

8. A semiconductor light emitting device, comprising:

a substrate having a first surface with a concave and convex configuration following a stripe pattern formed by etching;

a lower common electrode formed on said substrate at a second surface opposite said first surface;

current block layers formed in respective convex portions of said first surface of said substrate by impurity diffusion in such a manner that said convex portions have a conductivity type opposite to a conductivity type of said substrate;

a first clad layer formed on said first surface of said substrate and said current block layers in a corrugated configuration following said concave and convex configuration of said first surface of said substrate;

an active layer formed on said first clad layer in said corrugated configuration following said concave and convex configuration so that said first clad layer has a portion disposed between two successive light emitting portions of said active layer along an array line extending through said light emitting portions;

a second clad layer formed on said active layer in said corrugated configuration following said concave and convex configuration;

a cap layer formed on said second clad layer in said corrugated configuration following said concave and convex configuration and having a conductivity type opposite to a conductivity type of said second clad layer;

diffused regions formed respectively in concave portions of said cap layer and adjacent portions of said second clad layer by impurity diffusion in such a manner that electric currents flow through said diffused regions and are blocked by convex portions of said cap layer and said second clad layer; and an upper electrode formed on said cap layer.

9. A semiconductor light emitting device according to claim 8, comprising said portions of said first clad layer photo-coupling light emitted from said surrounding two successive light emitting portions of said active layer, and said emitted light having a continuous distribution in the near visible spectrum along said array line.

10. A semiconductor light emitting device according to claim 8, comprising said first and second current block layers isolating said light emitting portions and increasing current injection into said light emitting portions when a forward voltage is applied across said common electrode and said upper electrodes.

* * * * *

UNITED STATES PATENT AND TRADEMARK OFFICE
CERTIFICATE OF CORRECTION

PATENT NO. : 5,061,974
DATED : Oct. 29, 1991
INVENTOR(S) : Noriaki Onodera, Saburo Sasaki, Hiroyuki Iechi It is certified that error appears in the above-identified patent and that said Letters Patent is hereby corrected as shown below:

Cover Page, Inventors, please change "Saburo Saski" to --Saburo Sasaki--;

Assignees, please change "Ricoh Research Institute of General Electronics Co." to --Ricoh Research Institute of General Electronics Co., Ltd.

Signed and Sealed this

Thirty-first Day of March, 1992

Attest:

HARRY F. MANBECK, JR.

*Attesting Officer*     *Commissioner of Patents and Trademarks*